United States Patent [19]

Hsu

[11] Patent Number: 5,110,760
[45] Date of Patent: May 5, 1992

[54] METHOD OF NANOMETER LITHOGRAPHY

[75] Inventor: David S. Y. Hsu, Alexandria, Va.

[73] Assignee: The United States of America as represented by the Secretary of the Navy, Washington, D.C.

[21] Appl. No.: 589,758

[22] Filed: Sep. 28, 1990

[51] Int. Cl.$^5$ ............................................ H01L 21/44
[52] U.S. Cl. ..................................... 437/180; 437/44; 437/39; 437/201; 437/913; 148/DIG. 105; 148/DIG. 111
[58] Field of Search ................... 437/180, 39, 44, 228, 437/245, 201, 912, 913; 148/DIG. 105, DIG. 111; 156/643, 656

[56] References Cited

U.S. PATENT DOCUMENTS

| | | | |
|---|---|---|---|
| 4,343,082 | 8/1982 | Lepeelter et al. | 29/576 |
| 4,358,340 | 9/1982 | Fu | 437/43 |
| 4,432,132 | 2/1984 | Kinsbron et al. | 29/571 |
| 4,455,738 | 6/1984 | Homstom et al. | 29/571 |
| 4,502,914 | 3/1985 | Trumpp et al. | 156/643 |
| 4,568,565 | 2/1986 | Gupta et al. | 437/245 |
| 4,578,157 | 3/1986 | Halliwell et al. | 204/15 |
| 4,608,271 | 8/1986 | Hieber et al. | 437/200 |
| 4,645,563 | 2/1987 | Terada | 437/245 |
| 4,784,718 | 9/1988 | Mitani et al. | 156/643 |
| 4,803,181 | 2/1989 | Buchmann et al. | 437/228 |
| 4,886,763 | 12/1989 | Suzki | 437/61 |

OTHER PUBLICATIONS

Cooke, "A Review of LPCVD Metalization for Semiconductor Devices", Vacuum, vol. 35, No. 2, pp. 67-73, 1985.

Primary Examiner—Brian E. Hearn
Assistant Examiner—Tuan Nguyen
Attorney, Agent, or Firm—Thomas E. McDonnell; Barry A. Edelberg

[57] ABSTRACT

Nanometer thick vertical metallic structures are fabricated on a substrate by depositing a metallic layer on a substrate surface on which one or more buttresses are formed, etching the metallic layer to expose the horizontal surfaces of the substrate and the buttresses, and etching the substrate to remove the buttresses, thereby producing vertical structures on the substrate. The metallic layer is formed by thermal decomposition of a volatile metal-containing precursor gas in the presence of a carrier gas at low pressure, unlike that in conventional CVD reactors. The metallic layer thus formed has a grain size which is fraction of the thickness of the vertical structure.

21 Claims, 2 Drawing Sheets

METHOD OF NANOMETER LITHOGRAPHY

FIELD OF THE INVENTION

The present invention relates generally to lithographic techniques for microcircuit fabrication and more specifically a method for forming vertical structures of nanometer thickness on microcircuit substrates.

BACKGROUND OF THE INVENTION

The basis of all micro-fabrication techniques is the replication of a pattern in a substrate. In photolithography, a series of contact masks are used to transfer a series of patterns onto the surface of a microcircuit chip. As each pattern is formed on top of the last, individual circuit elements are built up layer by layer.

Narrow linewidth metal features are advantageously used for etch masks in microcircuit fabrication processes because of the generally higher durability of metal masks in conventional high energy fabrication processes such as plasma etching followed by annealing at high temperature. Narrow linewidth metal features are also independently useful as interconnections for microelectronic and nanoelectronic devices In addition, fabrication of devices which depend on quantum transport phenomena will likely require the use of metal features in the nanometer linewidth range.

Several alternative techniques have been developed to produce resist masks with more etching resistance. The most commonly employed method involves a two step resist mask production process. A first, relatively thick resist layer with a thickness of about 1000 nanometers (nm) is deposited on the oxide layer. Over this thick resist layer, a second, relatively thin resist layer having a thickness of about 1 nm is deposited. A pattern is developed in the thin resist layer and then both resist layers are selectively removed by reactive ion etching (RIE). However, RIE is a complex process, requiring significant expenditures for capital equipment and operator training In addition, the current linewidth resolution in commercial resist-related lithography is about 0.25 microns due to electron scattering which broadens the developed regions on the resist.

Another method for overcoming the difficulties resulting from the fabrication of smaller and smaller devices is the formation of a metal mask to replace the resist masks discussed above. U.S. Pat. No. 4,578,157 discloses a method of laser induced metal deposition onto a layer of gallium arsenide (GaAs) semiconductor substrate. Metal deposition or metallization is controlled by pulsing a laser beam through a metal bearing solution as the substrate is precisely moved by a computer controlled positioning device. This maskless process again requires substantial outlays for capital equipment. Photolithography also inherently limits the linewidth resolution to a fraction of a micron.

Methods for producing vertical sidewall structures on microcircuit substrates are also disclosed in U.S. Pat. Nos. 4,343,082, 4,432,132, 4,455,738, 4,502,914, 4,784,718, 4,803,181 and 4,886,763. The majority of the disclosed techniques are methods for forming insulating sidewalls using materials such as silicon oxide, silicon nitride, aluminum oxide and silylated organic polymers Sidewalls formed from these materials are used to provide improved electronic devices such as MESFETS and MOSFETS by producing improved self alignment in the device substructures along with reduced resistance. U.S. Pat. No. 4,358,340 discloses a method for fabricating submicron conducting structures by depositing a conducting film on a vertical step, and then thinning the conducting layer until only the film adjacent to the vertical step is left.

Heretofore, commercial lithographic methods of producing structures of less than 0.1 microns linewidth have not been developed.

SUMMARY OF THE INVENTION

Accordingly, the principal object of the present invention is to fabricate nanometer thick vertical metallic structures on a substrate.

Another object is to flexibly control the thickness of vertical metallic structures to be deposited on a substrate.

A further object is to fabricate vertical metallic structures wherein the grain size of the metallic layer is a fraction of the structure thickness.

Yet another object is to fabricate a vertical metallic structure in which placement of the structure is easily controlled by conventional fabrication techniques.

A further object is to fabricate vertical metallic structures wherein the structures are produced at a lower cost.

A yet further object is to fabricate vertical metallic structures having conditions conducive to the formation of relatively high purity metal structures using thermal decomposition of metal-containing precursor molecules.

These and other objects and advantages are achieved in accordance with the present invention by the steps of providing a substrate having at least one buttress on a first horizontal surface, the buttress having horizontal and vertical surfaces; depositing a metallic layer formed by thermal decomposition of a volatile metal-containing precursor gas and a carrier gas, preferably under effusive molecular beam conditions, on the horizontal and vertical surfaces of the buttress and on the horizontal first surface; removing the metallic layer from the horizontal surface of the buttress and the horizontal first surface; and etching the substrate so as to remove the buttress and leave the metallic layer deposited on the vertical surface of the buttress.

BRIEF DESCRIPTION OF THE DRAWINGS

These and other features and advantages of the present invention are disclosed in or apparent from the following detailed description of preferred embodiments. The preferred embodiments are described with reference to the drawings, in which like elements are denoted with like numbers, and in which.

DESCRIPTION OF THE PREFERRED EMBODIMENTS

Figure 1:
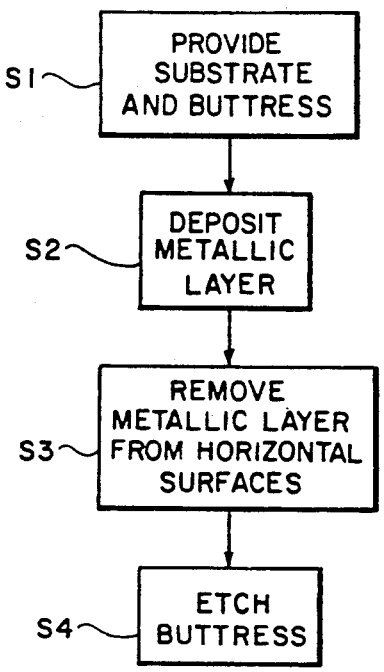
FIG. 1 is a flow chart showing the vertical sidewall fabrication process of the preferred embodiment of the present invention.
Figure 3A:
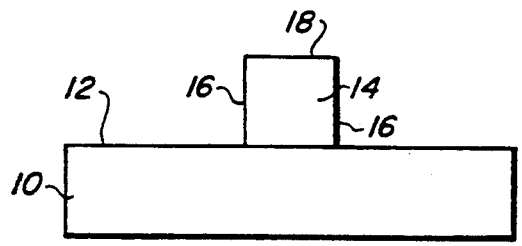
FIGS. 3A-3D are schematic side elevation views, partly in cross-section, of the resulting structures produced by the steps of FIG. 1.

Referring to the figures, at the start of the vertical sidewall formation process of the present invention (step S1 of FIG. 1), a buttress 14 is formed on a first horizontal surface 12 of a substrate 10. Preferably, substrate 10 is formed from silicon dioxide, while buttress 14 is formed from a material such as amorphous silicon, which allows the deposition of small grain sized metal layers and which is easily removed from the substrate material by conventional etching processes. Buttress 14, having vertical surfaces 16 and a horizontal surface 18, advantageously is formed using conventional lithographic fabrication techniques, e.g., photolithography. The work piece thus formed is shown in FIG. 3A.

During step S2, a metallic layer 20 is formed on surfaces 12, 16 and 18 having a uniform thickness and a small grain size, using thermal decomposition of a metal-containing precursor. Preferably, the deposition is performed in a high vacuum reactor or an ultra high vacuum reactor under very low metal-containing precursor and carrier gas pressure conditions, unlike those in conventional CVD reactors.

Figure 2:
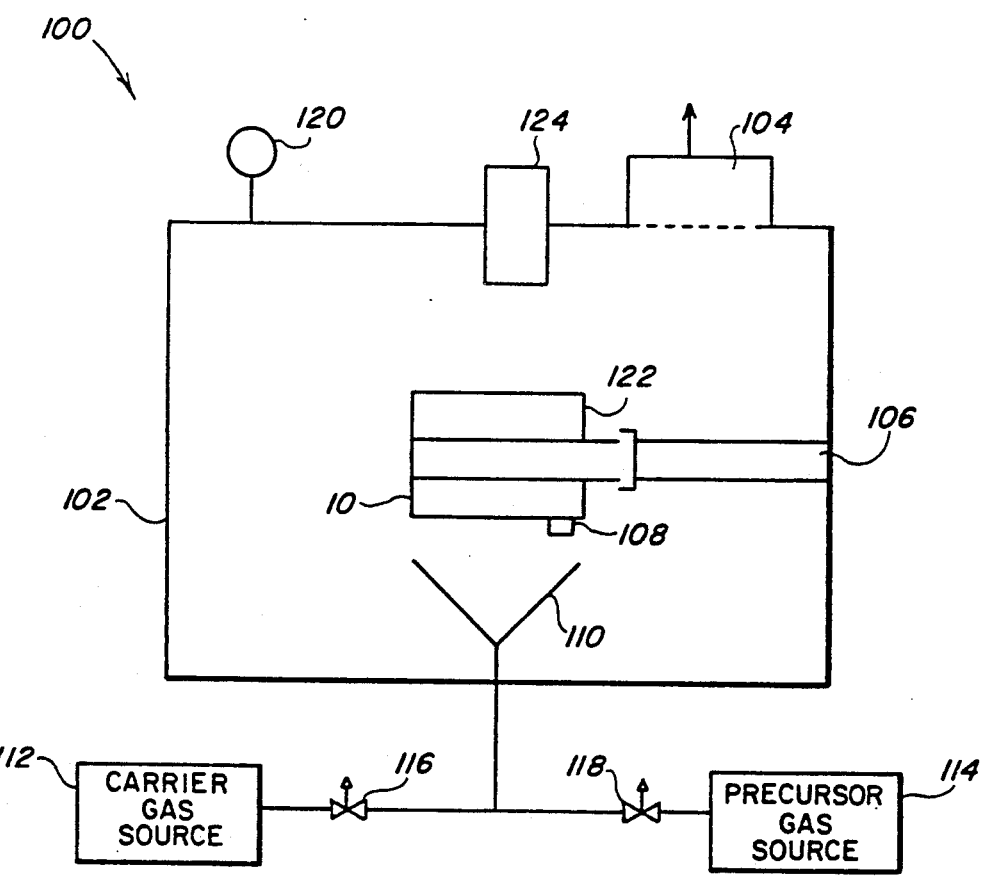
FIG. 2 is a schematic diagram showing a high vacuum reactor suitable for implementing steps S1, S2, S3 and S4 of the flow chart of FIG. 1.

Referring to FIG. 2, an exemplary high vacuum reactor 100 is shown comprising a vacuum chamber 102 containing a pump 104 vented to the outside, a manipulator 106 for supporting and positioning substrate 10, a temperature sensor 108 for sensing the temperature of substrate 10, and a doser 110. Doser 110 is connected to carrier gas source 112 and precursor gas source 114 via metering valves 116 and 118, respectively. Preferably, the diameter of doser 110 is substantially equal to the diameter of the work piece, i.e., substrate 10. A conventional ionization gage 120 is connected to chamber 102 for measuring the partial pressures of the precursor and carrier gases. Manipulator 106 advantageously includes a conventional resistive heater 122 for controlling the temperature of substrate 10. Preferably, pump 104 is a conventional cryo-trapped diffusion pump or a turbo-molecular pump. An ion gun 124 can be installed on the same chamber for sputtering and ion-assisted etching.

Figure 3B:
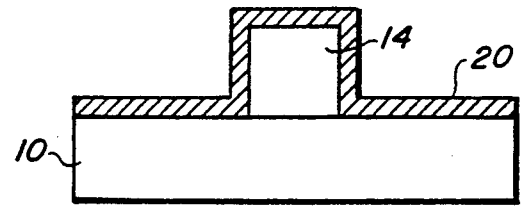

During step S2, substrate 10 is maintained at a predetermined temperature using sensor 108 and heater 122. A volatile metal-containing precursor gas and a carrier gas from doser 110 effusively flow onto substrate 10 at flow rates metered by valves 116 and 118, respectively, while pump 104 maintains chamber 102 at a predetermined partial pressure, preferably less than $10^{-4}$ Torr. Preferably, the volatile metal-containing precursor gas is selected from non-organic metal coordination compounds or organometallic compounds, including metal carbonyls. Precursor gas molecules advantageously contain ligands, e.g., $PF_3$, surrounding a metallic ion such as platinum (Pt), thereby forming a precursor gas $Pt(PF_3)_4$. Other volatile metal-containing precursors, such as $Ni(PF_3)_4$, $Pd(PF_3)_4$, $Fe(PF_3)_5$, $W(PF_3)_6$, $Cr(PF_3)_6$, $Mo(PF_3)_6$, $Co(PF_3)_6$, $Ru(PF_3)_5$, $Rh_2(PF_3)_8$, $Re_2(PF_3)_{10}$, $Ir_2(PF_3)_8$, and appropriate mixtures of organometallics, can also be advantageously used as the precursor gas. Preferably, the carrier gas is hydrogen. The resulting structure is shown in FIG. 3B.

It will be appreciated that the use of volatile metal-containing precursor gas advantageously provides a highly uniform film, subject to limitations from nucleation and growth characteristics inherent to the particular metal-substrate system, due to the enhanced ability of a precursor gas to diffuse on surfaces 12, 16 and 18 prior to decomposition during the CVD process. It will be further appreciated that careful selection of the volatile metal-containing precursor gas and control of the environment in the vacuum reactor are required to fabricate vertical metallic structures according to the present invention. Other factors, such as nucleation, which depend on the precursor-substrate and precursor-metal and metal-metal interactions during CVD, may inhibit the formation of small grain size metallic layers on the surfaces. In a separate experiment, nickel (Ni) films on silicon, produced, for example, by the thermal decomposition of $Ni(CO)_4$, result in metallic layers which are much more porous than films produced by thermal decomposition of $Pt(PF_3)_4$. Metallic structures, such as vertical sidewalls with thicknesses of less than 50 nm, require a grain size only a fraction of the thickness of the sidewall The use of $Pt(PF_3)_4$ as the volatile metal-containing precursor gas advantageously produces a grain size of less than 15 nm under conditions used in the present invention.

Deposition of metallic layer 20 on substrate 10 and buttress 14 is a thermal decomposition process employing effusive molecular beam conditions and is therefore dependent on the partial pressure of the precursor and carrier gases as well as on the temperature of substrate 10. For example, the deposition rate of metallic layer 20 is controlled by the substrate 10 temperature. Temperatures below about 230° C. result in a deposition rate too low for effective processing. Temperatures above about 300° C. produce high deposition rates, but also result in the formation of metal silicides in metallic layer 20. Metal silicides are produced by reaction of the precursor metal with silicon in buttress 14. The amount of metal silicide thus formed is dependant on processing temperature and the processing time. At higher temperatures, e.g., above about 300° C., and especially above about 350° C., Si diffuses into and reacts with the deposited metallic layer 20 to form metal silicides. Metal silicide formation advantageously is suppressed by selecting a processing temperature below about 300° C. or by retaining the native oxide on the surface of the buttress 14. When metal silicide formation is allowable, substrate temperatures up to about 350° C. can be used to reduce processing times. In addition, higher temperatures increase the grain size of layer 20, thereby lowering the achievable resolution. Thus, grain size and metal silicide formation is controlled by controlling the processing temperature.

Deposition of metallic layer 20 on substrate 10 and buttress 14 is further dependant on the partial pressure of the precursor and carrier gases. Preferably, effusive molecular beam conditions are used, although the process of the present invention may also work at higher deposition pressures. A relatively low partial pressure, i.e., below about $10^{-3}$ Torr and preferably between about $10^{-5}$ and $10^{-6}$ Torr, of the precursor gas allows formation of a nonporous high purity metallic layer 20 if not affected by possible inherently adverse nucleation and growth processes. Volatile metal-containing precursor gases have room temperature vapor pressures of at least about $10^{-7}$ Torr, preferably at least $10^{-6}$ Torr and most preferably at least $10^{-5}$ Torr. Maintaining the precursor gas at a predetermined low partial pressure advantageously provides a longer distance for the precursor gas to diffuse on the surface, thus permitting formation of a uniform film and inherently offers greater control over the thickness of the film to be deposited. In addition, less side reactions occur than in conventional CVD. As the partial pressure of the precursor gas increases, the deposition rate increases with the resulting loss of control over the thickness and resolution. A lower processing temperature advantageously compensates for a high partial pressure up to a point.

The partial pressure of the carrier gas is preferably at least about 5 to 10 times higher than the partial pressure of the precursor gas. The flow rate of the carrier gas must be high enough to produce a uniform distribution of precursor gas across the area of substrate 10 where metallic layer 20 deposition is to occur. In addition, the nature and the flow rate of the carrier gas is selected so as to provide for scavenging of the precursor gas decomposition products, to form highly volatile products that can easily escape from the surface, thus preventing incorporation of decomposition products into the metallic layer 20. The total pressure in the reactor, however, must not be too high so as to impede the rapid desorption of decomposition or scavenging reaction products preferably the carrier gas prevents oxidation of the materials forming substrate 10, buttress 14 and metallic layer 20. Hydrogen and/or deuterium can be advantageously used as the antioxidant carrier gas.

In the preferred embodiment, the volatile metal-containing precursor gas advantageously has a vaporization pressure at room temperature greater than $10^{-5}$ Torr. In reactor 100, the partial pressure of the precursor gas is controlled by valve 118 to be at least about $2 \times 10^{-6}$ Torr, while the hydrogen carrier gas has a partial pressure, metered by valve 116, of about $2 \times 10^{-5}$ Torr. With the substrate 10 temperature in the range of about 280°-300° C., and using a dosing time of about 8-15 minutes, metallic layer 20 having a suitably small grain size and a thickness of about 90-150 nm is formed Substrate 10 temperatures as low as 230° C. can be used. Considerable reductions in layer thickness can be obtained by reducing the precursor gas pressure and dosing times. It is likely that the grain size can be reduced to less than 10 nm. The layer thickness, e.g. linewidth, of 20 nm is achievable.

Figure 3C:
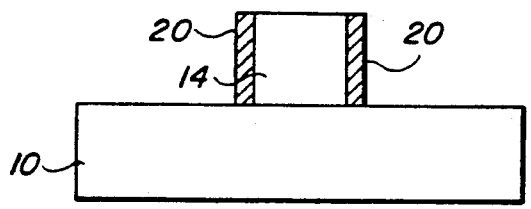
Figure 3D:
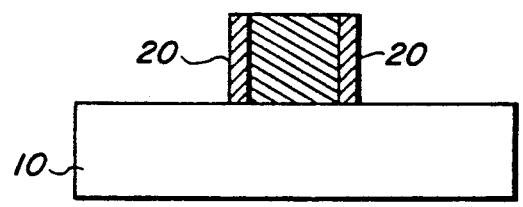
Figure 4A:
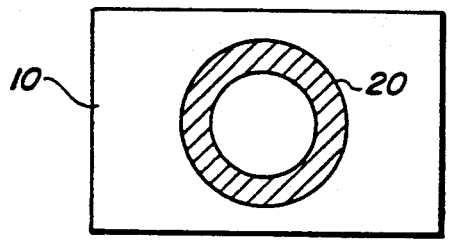
FIGS. 4A and 4B are plan views, partly in cross-section, of the vertical sidewall structure of the resultant structure shown in FIG. 3D
Figure 4B:
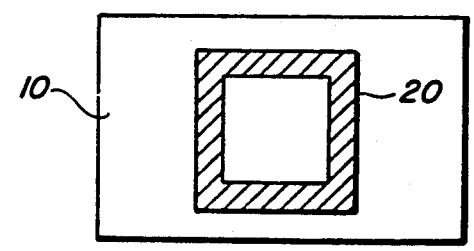

During Step S3, the portion of metallic layer 20 on the horizontal surfaces 12 and 16 is removed by conventional etching methods. i.e., unidirectional low energy ion beam sputtering or RIE, thereby producing the structure shown in FIG. 3C. During Step S4, buttress 14 is selectively etched away using conventional etching techniques, e.g., pyrolitic or reactive ion etching. Preferably, there should not be significant etching of the substrate 10 during the etching process. In addition, buttress 14 advantageously is removed by vaporization when the melting, boiling or decomposition temperature of the material forming buttress 14 is much less than that of the metal 20 and of the material forming substrate 10. The resulting structure is shown in FIG. 3D. Thus, vertical metallic structures, such as those shown in FIGS. 4A and 4B, are formed from metallic layer 20 on the surface 12 of substrate 10.

Having described the invention, the following examples are given to illustrate specific applications of the invention including the best mode now known to perform the invention. These specific examples are not intended to limit the scope of the invention described in this application.

EXAMPLES (a) Experimental apparatus: The substrate was mounted on a resistively heated base at the end of a Varian manipulator with tilt control. In the deposition mode, the front of the substrate which contained the initial buttress structures faced downward toward a tubular doser with a diameter comparable to the substrate dimensions. The separation between the substrate and the tip of the doser was about 3 mm. The doser was connected to the feed line of the carrier gas whose pressure was controlled by the use of a metering valve. Downstream to the carrier gas metering valve, the precursor was injected and its pressure was controlled by a second precision metering valve. A thin thermocouple was pressed against the front surface of the substrate by the use of a spring for monitoring the temperature. The above-described arrangement was contained inside a high vacuum chamber pumped by a cryotrapped 6-inch diffusion pump. The pressures of the precursor and the carrier gases are taken as measured by an ionization gauge on the chamber.

(b) Experiments: In each case, the substrate was cleaned by dipping in a concentrated sulfuric acid-hydrogen peroxide solution, rinsing in deionized water, and nitrogen blow-drying. Then it was carefully mounted on the heater base on the manipulator.

Then, the chamber was pumped down to as high a vacuum as possible (typically $1 \times 10^{-7}$). With continuous pumping and with the substrate in the deposition position, the carrier gas, hydrogen, was admitted into the reactor and stabilized at $2 \times 10^{-5}$ Torr. Next, the substrate was heated up to and stabilized at the deposition temperature of about 280° C. for about 15 to 30 minutes. Now, about $2 \times 10^{-6}$ Torr of the precursor molecule, $Pt(PF_3)_4$ was admitted. After 10 minutes, the precursor gas was shut off, and the substrate was allowed to sit at the same temperature in the presence of hydrogen for about 15 minutes, after which the substrate was allowed to cool slowly to about room temperature.

The hydrogen was shut off. The substrate had a shiny metallic layer. The substrate was then tilted and rotated to face a Physical Electronic (Perkin Elmer) sputtering ion gun. A neon ion beam was impinged perpendicularly onto the substrate surface at 2.0 keV energy and at a flux of about 60 microamperes per square centimeter. After visually sighting the appearance of a dark spot (this was the color of the underlying substrate where the ion beam has sputtered off the Pt metal), typically about 10 minutes after initiating sputtering, about $1 \times 10^{-5}$ Torr of an etchant gas, such as xenon difluoride or chlorine, was admitted to the reactor. At this time, the temperature of the substrate can be increased to typically 100°-150° C. to aid in the desorption of etch products. With the concurrent Ne ion beam in operation at 500 eV or 1000 eV, the ion-assisted etching process selectively removed the buttress material faster than the Pt sidewalls. After a suitable length of time, about 20 minutes, the experiment was stopped and the substrate was removed for analysis. It should be pointed out here that reactive ion etching could have been used instead of ion-assisted etching and that the etching step could have been carried out in a different apparatus.

The linewidth of the Pt sidewall was measured by examination with a scanning electron microscope. The above conditions typically yielded a Pt sidewall linewidth of about 100-150 nm and a Pt grain size of less than 15 nm. The elemental analysis was carried out by using a line scan with a scanning Auger microscope set on the Pt 1967 eV line. The results showed that there was Pt only on the sidewall and an absence of Pt elsewhere. Further Auger analysis showed no detectable fluorine or phosphorus.

The method of the present invention advantageously can be used in depositing large arrays of nanometer linewidth, e.g., less than 1000 angstroms, to form metallic structures having various geometries. Thus, the present invention can be used in forming field emitters, which are produced with a few hundred angstrom linewidths and a height of several microns, and periodic metal quantum wires, which are used for the study and application of quantum transport phenomena. In addition, the present invention, when applied to the fabrication of field emitters, is particularly suited to high power microwave and millimeter wave devices and high resolution video displays. The present invention is also suitable for producing nanometer-sized metal etch masks, which are more durable in annealing environments than conventional organic resist masks. It will be appreciated that metallic structures formed according to the present invention can also be used as deposition sites for catalyzed deposition of other metallic or semiconductor structures, thereby providing multilayer vertical structures. For example, a metallic structure used as a field emitter advantageously can be sheathed in an additional metallic layer (not shown) used for decreasing the work function of the field emitter.

It will be appreciated that dimensional control of the vertical metallic structures formed according to the present invention requires both dimensional control of buttress 14, to control the placement and height of the deposited sidewall, as well as control of the metallic layer thickness. Layer thickness, and thus linewidth and resolution, are advantageously controlled by the low partial pressure and the dosing time of the precursor gas as well as the substrate temperature.

It will also be appreciated that a relatively high purity metallic layer 20, i.e., containing no detectable fluorine or phosphorus decomposition byproducts, is obtained because the low pressure of the precursor gas and carrier gas allow the impurity byproducts to escape rather than to be buried in metallic layer 20.

It will be further appreciated that the present invention provides a cost effective method for fabricating vertical metallic structures on substrate 10 since alignment of the structures is accomplished during preparation of the work piece, i.e., formation of buttress 14 on substrate 10. During the fabrication process according to the present invention, each of the fabrication steps is self-aligning.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A method for fabricating a vertical metallic structure having nanometer linewidths on a substrate, comprising the steps of:
   providing a substrate having at least one buttress on a first horizontal surface, said buttress having horizontal and vertical surfaces;
   depositing a metallic layer formed by thermal decomposition of a volatile metal-containing precursor gas, selected from the group consisting of metal carbonyls and molecules including a metal coordination compound including $PF_3$ ligands and a metal, in a gaseous mixture consisting essentially of said precursor gas and a carrier gas on said horizontal and vertical surfaces of said buttress and on said substrate horizontal first surface, said precursor gas having a partial pressure of less than $10^{-5}$ Torr and said carrier gas having a partial pressure of less than $10^{-4}$ Torr, said substrate being at a temperature of about 230° C. to about 350° C. during said deposition;
   removing said metallic layer from said horizontal surface of said buttress and said substrate horizontal first surface; and
   etching said substrate so as to remove said buttress and leave said metallic layer deposited on said vertical surface of said buttress.

2. The method of claim 1, wherein said precursor gas contains platinum.

3. The method of claim 1, wherein said precursor gas is selected from the group consisting of $Pt(PF_3)_4$, $Ni(PF_3)_4$, $Pd(PF_3)_4$, $Fe(PF_3)_5$, $W(PF_3)_6$, $Cr(PF_3)_6$, $Mo(PF_3)_6$, $Co(PF_3)_6$, $Ru(PF_3)_5$, $Rh_2(PF_3)_8$, $Re_2(PF_3)_{10}$ and $Ir_2(PF_3)_8$.

4. The method of claim 1, wherein said carrier gas is hydrogen.

5. The method of claim 1, wherein said precursor gas has a vapor pressure at room temperature of at least $10^{-7}$ Torr.

6. The method of claim 1, wherein said metallic layer reacts with said buttress so as to produce a metal silicide.

7. The method of claim 1, comprising the further step of depositing a material different from said metallic layer on the vertical metallic structure so as to produce a multilayer vertical structure.

8. The method of claim 1, wherein the horizontal and vertical surfaces of said buttress comprise silicon.

9. The method of claim 8, wherein the horizontal and vertical surfaces of said buttress comprise amorphous silicon having native oxide retained thereon.

10. The method of claim 1, wherein the partial pressure of said carrie gas is about 5 to 10 times higher than the partial pressure of the precursor gas.

11. The method of claim 1, wherein the partial pressure of said precursor gas is between about $10^{-5}$ and $10^{-6}$ Torr.

12. The method of claim 1, wherein said first horizontal surface of said substrate is silicon dioxide and said horizontal and vertical surfaces of said buttress are selected from the group consisting of silicon and silicon dioxide.

13. The method of claim 1, wherein said deposition occurs at a temperature of about 230° C. to about 300° C.

14. A method for fabricating a vertical metallic structure having nanometer linewidths on a substrate, comprising the steps of:
   providing a substrate having a horizontal first surface and having at least one buttress deposited on said first substrate surface, said buttress having horizontal and vertical surfaces;
   depositing a metallic layer formed by the thermal decomposition of a $Pt(PF_3)_4$ precursor gas and hydrogen carrier gas on said horizontal and vertical surfaces of said buttress and on said first substrate surface, said precursor gas having a partial pressure of less than $10^{-5}$ Torr and said hydrogen gas having a partial pressure of less than $10^{-4}$ Torr, said substrate being at a temperature of about 230° C. to about 350° C. during said deposition;

removing said metallic layer from said horizontal surface of said buttress and said first substrate surface so as to retain a portion of said metallic layer formed on said vertical surfaces of said buttress; and etching said substrate so as to remove said buttress and leave said portion of said metallic layer deposited on said vertical surface of said buttress.

15. The method of claim 14, wherein the partial pressure of said carrier gas is about 5 to 10 times higher than the partial pressure of the precursor gas.

16. The method of claim 14, wherein the partial pressure of said precursor gas is between about $10^{-5}$ and $10^{-6}$ Torr.

17. The method of claim 12, wherein said first horizontal surface of said substrate is silicon dioxide and said horizontal and vertical surfaces of said buttress are selected from the group consisting of silicon and silicon dioxide.

18. The method of claim 14, wherein said deposition occurs at a temperature of about 230° C. to about 300° C.

19. A method for fabricating a structure, including at least one vertical surface and at least one horizontal surface, on a substrate, said structure having a metal layer of less than 0.1 micron thickness thereon, comprising the steps of:

providing a substrate having at least one structure with at least one horizontal surface and at least one vertical surface;

depositing a metallic layer of less than 0.1 micron thickness, by thermal decomposition of a volatile metal-containing precursor gas, selected from the group consisting of metal carbonyls and molecules including a metal coordination compound including $PF_3$ ligands and a metal, in a gaseous mixture consisting essentially of said precursor gas and a carrier gas, on said at least one horizontal surface and said at least one vertical surface, said precursor gas having a partial pressure of less than $10^{-5}$ Torr and said carrier gas having a partial pressure of less than $10^{-4}$ Torr, said substrate being at a temperature of about 230° C. to about 350° C. during said deposition.

20. The method of claim 19, wherein the partial pressure of said precursor gas is between about $10^{-5}$ and $10^{-6}$ Torr.

21. The method of claim 19, wherein the partial pressure of said carrier gas is about 5 to 10 times higher than the partial pressure of the precursor gas.

* * * * *